(12) United States Patent
Kawashima et al.

(10) Patent No.: US 10,388,660 B2
(45) Date of Patent: Aug. 20, 2019

(54) SEMICONDUCTOR DEVICE AND METHOD FOR MANUFACTURING THE SAME

(71) Applicant: Renesas Electronics Corporation, Koutou-ku, Tokyo (JP)

(72) Inventors: Yoshiyuki Kawashima, Tokyo (JP); Takashi Hashimoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/796,815

(22) Filed: Oct. 29, 2017

(65) Prior Publication Data

US 2018/0182767 A1  Jun. 28, 2018

(30) Foreign Application Priority Data

Dec. 27, 2016  (JP) ................. 2016-252691

(51) Int. Cl.
*H01L 29/78* (2006.01)
*H01L 27/1157* (2017.01)
*G11C 16/10* (2006.01)
*H01L 29/423* (2006.01)
*H01L 29/51* (2006.01)
(Continued)

(52) U.S. Cl.
CPC ...... *H01L 27/1157* (2013.01); *G11C 16/0483* (2013.01); *G11C 16/10* (2013.01); *G11C 16/26* (2013.01); *H01L 21/022* (2013.01); *H01L 21/0217* (2013.01); *H01L 21/02164* (2013.01); *H01L 21/28282* (2013.01); *H01L 23/528* (2013.01); *H01L 29/4234* (2013.01); *H01L 29/42344* (2013.01); *H01L 29/513* (2013.01);
*H01L 29/518* (2013.01); *H01L 29/6659* (2013.01); *H01L 29/66833* (2013.01);
(Continued)

(58) Field of Classification Search
CPC ......... H01L 27/11521; H01L 29/42328; H01L 27/115; H01L 29/7881; H01L 29/788
See application file for complete search history.

(56) References Cited

U.S. PATENT DOCUMENTS 6,784,933 B1 * 8/2004 Nakai .................. H01L 27/115
257/291
7,011,999 B2 * 3/2006 Minami .............. H01L 27/0629
257/E21.004

(Continued)

FOREIGN PATENT DOCUMENTS

JP  2004-200504 A  7/2004

OTHER PUBLICATIONS

Extended European Search Report dated Jul. 20, 2018, in European Patent Application No. EP17203057.9.
(Continued)

*Primary Examiner* — Jaehwan Oh
(74) *Attorney, Agent, or Firm* — Shapiro, Gabor and Rosenberger, PLLC

(57) ABSTRACT

A semiconductor device in which the cell size is small and disturbance in reading operation is suppressed, and a method for manufacturing the semiconductor device. A first memory cell has a first memory transistor. A second memory cell has a second memory transistor. A control gate is shared by the first memory cell and the second memory cell. In plan view, the control gate is sandwiched between a first memory gate of the first memory transistor and a second memory gate of the second memory transistor.

14 Claims, 21 Drawing Sheets

(51) Int. Cl.

| | | |
|---|---|---|
| *H01L 29/792* | (2006.01) | |
| *H01L 29/66* | (2006.01) | |
| *H01L 21/28* | (2006.01) | |
| *H01L 21/02* | (2006.01) | |
| *G11C 16/26* | (2006.01) | |
| *H01L 23/528* | (2006.01) | |
| *G11C 16/04* | (2006.01) | |
| *G11C 16/34* | (2006.01) | |

(52) U.S. Cl.
CPC ........ *H01L 29/7833* (2013.01); *H01L 29/792* (2013.01); *G11C 16/3418* (2013.01)

(56) References Cited

U.S. PATENT DOCUMENTS

| | | | | |
|---|---|---|---|---|
| 9,391,151 | B2* | 7/2016 | Wu | H01L 29/42328 |
| 9,620,604 | B2* | 4/2017 | Roy | H01L 27/1157 |
| 9,653,470 | B2* | 5/2017 | La Rosa | G11C 16/0433 |
| 2004/0013027 | A1* | 1/2004 | Kanai | G11C 16/0466 365/236 |
| 2004/0262668 | A1* | 12/2004 | Wang | H01L 27/115 257/315 |
| 2007/0147122 | A1* | 6/2007 | Arai | G11C 16/0483 365/185.18 |
| 2008/0217675 | A1* | 9/2008 | Liu | H01L 21/28273 257/321 |
| 2009/0184364 | A1* | 7/2009 | Terada | H01L 27/11521 257/326 |
| 2011/0186922 | A1* | 8/2011 | Takimoto | H01L 29/788 257/319 |
| 2015/0348981 | A1* | 12/2015 | La Rosa | G11C 16/0433 365/185.29 |
| 2018/0182767 | A1* | 6/2018 | Kawashima | G11C 16/0483 |

OTHER PUBLICATIONS

Office Action, dated Apr. 16, 2019, in U.S. Appl. No. 16/110,555.

\* cited by examiner

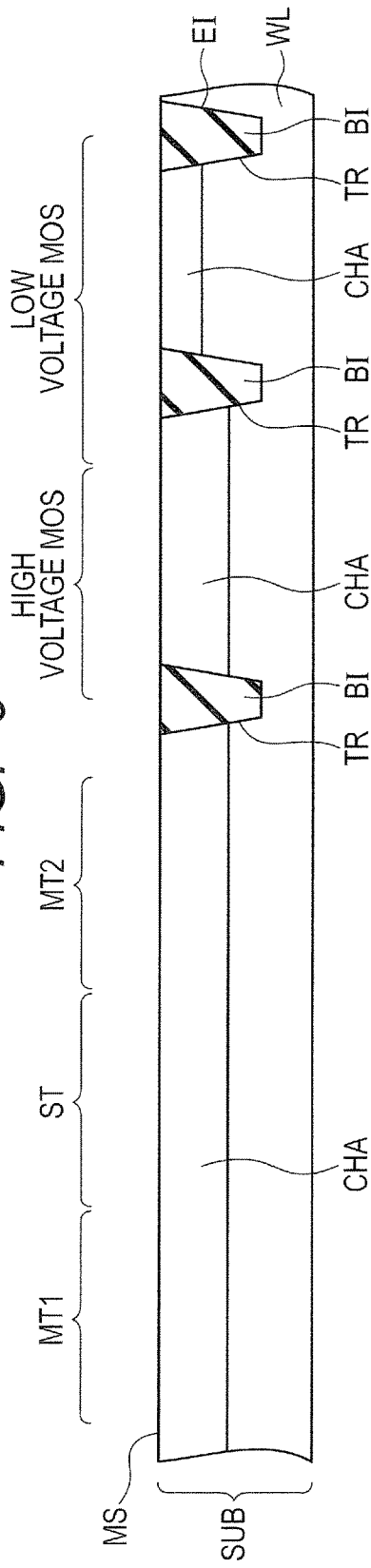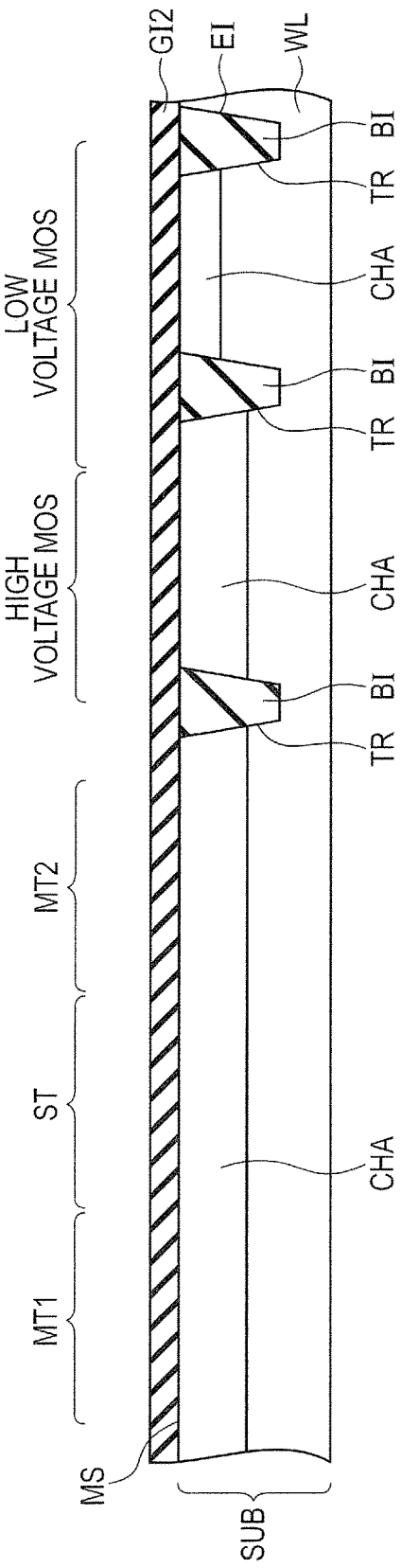

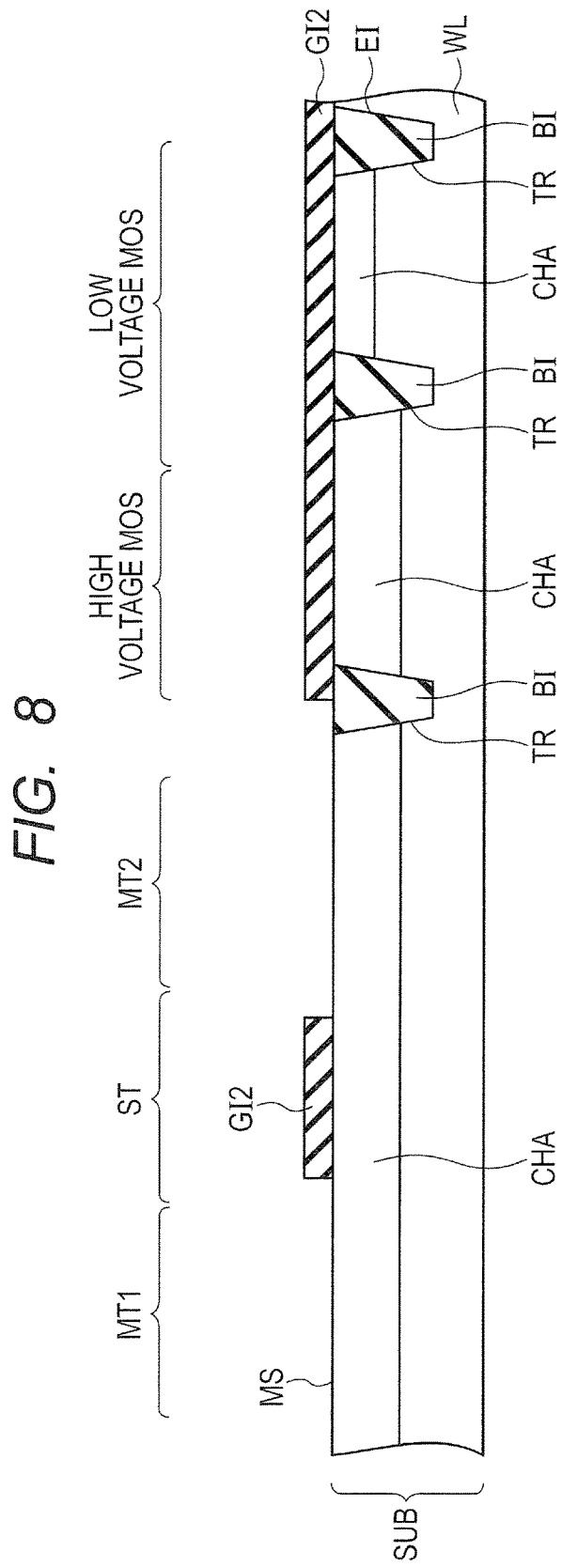

COMPARATIVE EXAMPLE 1

COMPARATIVE EXAMPLE 2

FIRST EMBODIMENT

SEMICONDUCTOR DEVICE AND METHOD FOR MANUFACTURING THE SAME

CROSS-REFERENCE TO RELATED APPLICATIONS

The disclosure of Japanese Patent Application No. 2016-252691 filed on Dec. 27, 2016 including the specification, drawings and abstract is incorporated herein by reference in its entirety.

BACKGROUND

The present invention relates to a semiconductor device and a method for manufacturing the same.

Some semiconductor devices include non-volatile memories. A non-volatile memory is an element which retains stored data even when the power is off. A highly functional semiconductor device can be provided by mounting a non-volatile memory over a semiconductor substrate which is used in a semiconductor device for logical operation. A semiconductor device which includes such a non-volatile memory is widely used as an embedded microcomputer in industrial machines, home electric appliances, in-vehicle devices and so on.

One type of non-volatile memory cell structure is a cell structure which includes two transistors: a transistor for selection and a transistor for memory. This type of cell structure is disclosed, for example, in Japanese Unexamined Patent Application Publication No. 2004-200504.

The selection transistor selects a cell of a non-volatile memory. The memory transistor stores data by changing the threshold voltage by charge accumulation. The memory transistor has a MONOS (Metal Oxide Nitride Oxide Semiconductor) structure.

Another type of non-volatile memory cell structure is a structure which has only a memory transistor for charge accumulation.

SUMMARY

For the memory cell structure which uses two transistors as mentioned above, one problem is that because of the use of two transistors, the cell size must be large enough to house the transistors.

On the other hand, for the memory cell structure which uses only one transistor as mentioned above, one problem is that the reliability is low since disturbance occurs in reading operation.

The above and further objects and novel features of the present invention will more fully appear from the following detailed description in this specification and the accompanying drawings.

According to one aspect of the present invention, there is provided a semiconductor device in which a first memory cell has a first memory transistor, a second memory cell has a second memory transistor and a control gate is shared by the first memory cell and the second memory cell. In plan view, the control gate is sandwiched between a first memory gate of the first memory transistor and a second memory gate of the second memory transistor.

According to a second aspect of the present invention, the first memory transistor has a first memory gate and a selection transistor has a control gate. The first memory transistor and the selection transistor share a first impurity region disposed between the first memory gate and the control gate in plan view. A first source line is electrically coupled to the first impurity region.

According to the first and second embodiments, it is possible to provide a semiconductor device in which the cell size is small and disturbance in reading operation is suppressed, and a method for manufacturing the same.

BRIEF DESCRIPTION OF THE DRAWINGS

FIGS. 5A and 5B illustrate reading operation and writing operation of the memories shown in FIGS. 3 and 4, in which FIG. 5A shows reading operation and FIG. 5B shows writing operation;

FIG. 6 is a schematic sectional view which shows the first step of a method for manufacturing the semiconductor device shown in FIGS. 3 and 4;

FIG. 7 is a schematic sectional view which shows the second step of the method for manufacturing the semiconductor device shown in FIGS. 3 and 4;

FIG. 8 is a schematic sectional view which shows the third step of the method for manufacturing the semiconductor device shown in FIGS. 3 and 4;

FIGS. 20A, 20B, and 20C are plan views, in which FIG. 20A shows the structure of Comparative Example 1, FIG. 20B shows the structure of Comparative Example 2, and FIG. 20C shows the structure of the semiconductor device according to the first embodiment;

FIGS. 23A and 23B illustrate reading operation and writing operation of a semiconductor device according to a second embodiment of the invention, in which FIG. 23A shows reading operation and FIG. 23B shows writing operation;

DETAILED DESCRIPTION

Next, preferred embodiments of the present invention will be described referring to drawings.

First Embodiment

Figure 1:
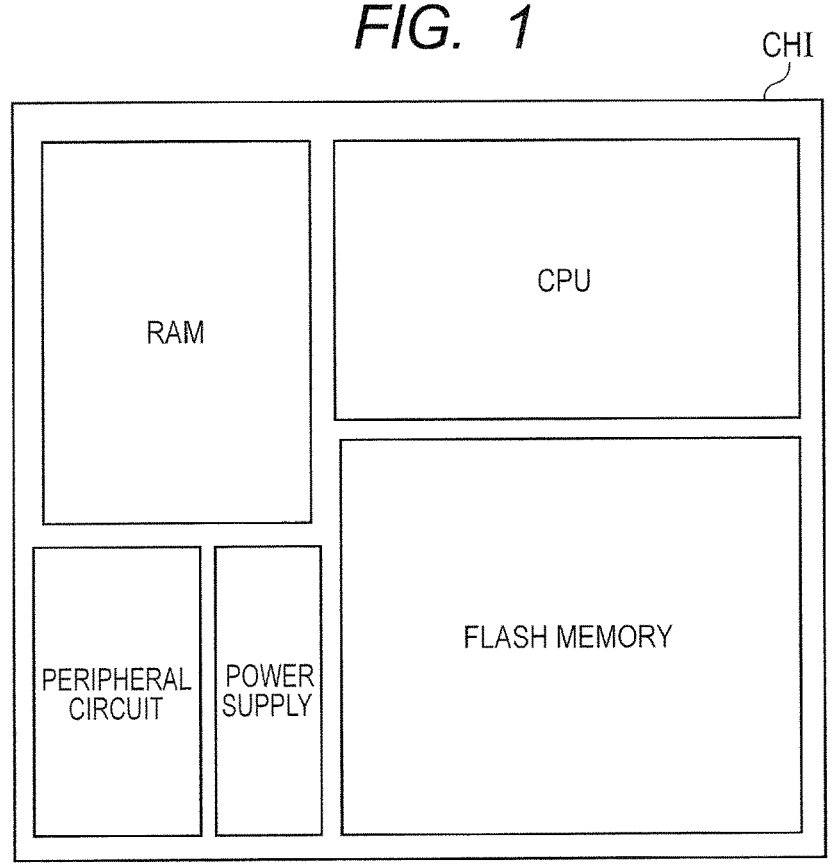
FIG. 1 is a plan view which schematically shows the structure of a semiconductor device in the form of a chip according to a first embodiment of the invention.

As shown in FIG. 1, a semiconductor device CHI according to the first embodiment is in the form of a chip and has a semiconductor substrate. Various regions including a RAM (Random Access Memory), a CPU (Central Processing Unit), a flash memory, a power supply, and a peripheral circuit are disposed on the main surface of the semiconductor substrate.

The semiconductor device according to this embodiment is not limited to a semiconductor device in the form of a semiconductor chip but it may be in the form of a wafer or a package sealed with sealing resin.

Next, the circuit configuration of the semiconductor device according to this embodiment will be described referring to FIG. 2.

Figure 2:
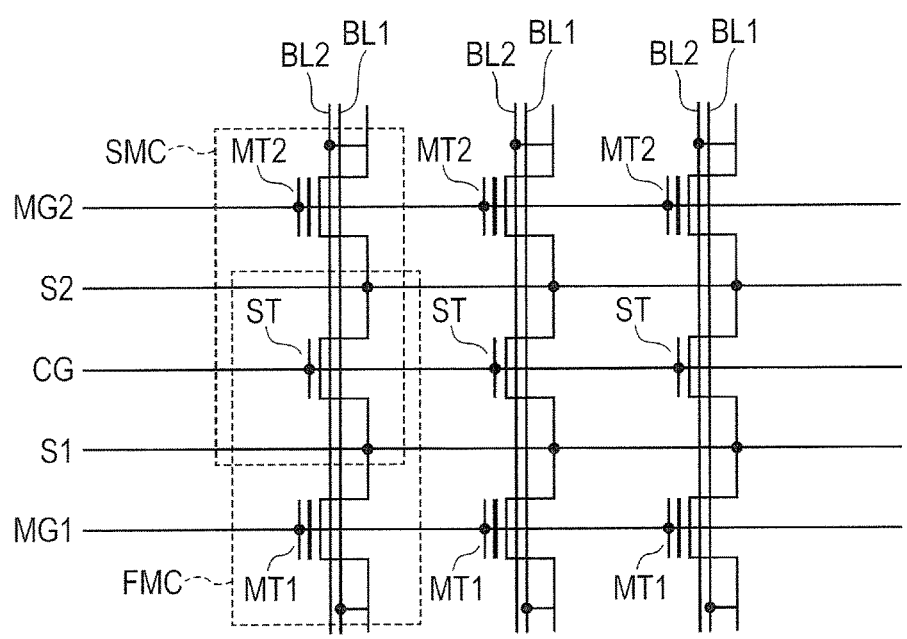
FIG. 2 is a circuit diagram of memory cells formed in a memory cell array in the semiconductor device shown in FIG. 1.

As shown in FIG. 2, in a memory cell array, a plurality of memory cells are arranged in a matrix pattern. Each of the memory cells has a transistor for memory and a transistor for selection. Two memory cells adjacent to each other in the direction in which a bit line extends shares one transistor for selection. Concrete details of the circuit configuration are as follows.

Among the plural memory cells, a first memory cell FMC has a memory transistor MT1 (first memory transistor) and a selection transistor ST. One of a pair of impurity regions to be source/drain regions of the memory transistor MT1 and one of a pair of impurity regions to be source/drain regions of the selection transistor ST are electrically coupled to each other.

The one of the pair of impurity regions to be source/drain regions of the memory transistor MT1 and the one of the pair of impurity regions to be source/drain regions of the selection transistor ST are both electrically coupled to a source line S1 (first source line). The other of the pair of impurity regions to be source/drain regions of the memory transistor MT1 is electrically coupled to a bit line BL1 (first bit line).

Among the memory cells, a second memory cell SMC has a memory transistor MT2 (second memory transistor) and a selection transistor ST. One of a pair of impurity regions to be source/drain regions of the memory transistor MT2 and the other of a pair of impurity regions to be source/drain regions of the selection transistor ST are electrically coupled to each other.

The one of the pair of impurity regions to be source/drain regions of the memory transistor MT2 and the other of the pair of impurity regions to be source/drain regions of the selection transistor ST are both electrically coupled to a source line S2 (second source line). The other of the pair of impurity regions to be source/drain regions of the memory transistor MT2 is electrically coupled to a bit line BL2 (second bit line).

The first memory cell FMC and the second memory cell SMC are adjacent to each other in the direction in which the bit lines BL1 and BL2 extend. The first memory cell FMC and the second memory cell SMC share the selection transistor ST. For this reason, only one selection transistor ST is located between the memory transistors MT1 and MT2 arranged side by side in the direction in which the bit lines BL1 and BL2 extend.

The combination of the first memory cell FMC and the second memory cell SMC as mentioned above is repeatedly arranged in the row direction (direction in which memory gates MG1 and MG2 extend) and the column direction (direction in which the bit lines BL1 and BL2 extend).

The memory gates MG1 of the plural memory transistors MT1 arranged in the row direction are electrically coupled to each other. Similarly, the memory gates MG2 of the plural memory transistors MT2 arranged in the row direction are electrically coupled to each other. Also, control gates CG of the plural selection transistors ST arranged in the row direction are electrically coupled to each other.

The coupling portions between the memory transistor MT1 and the selection transistor ST in each of the first memory cells FMC arranged in the row direction are electrically coupled by the source line S1. The coupling portions between the memory transistor MT2 and the selection transistor ST in each of the second memory cells SMC arranged in the row direction are electrically coupled by the source line S2.

The other ones of the pairs of impurity regions of the memory transistors MT1 in the first memory cells FMC arranged in the column direction are electrically coupled by the bit line BL1. The other ones of the pairs of impurity regions of the memory transistors MT2 in the second memory cells SMC arranged in the column direction are electrically coupled by the bit line BL2.

Next, details of the semiconductor device according to this embodiment will be described referring to FIGS. 3 and 4.

Figure 4:
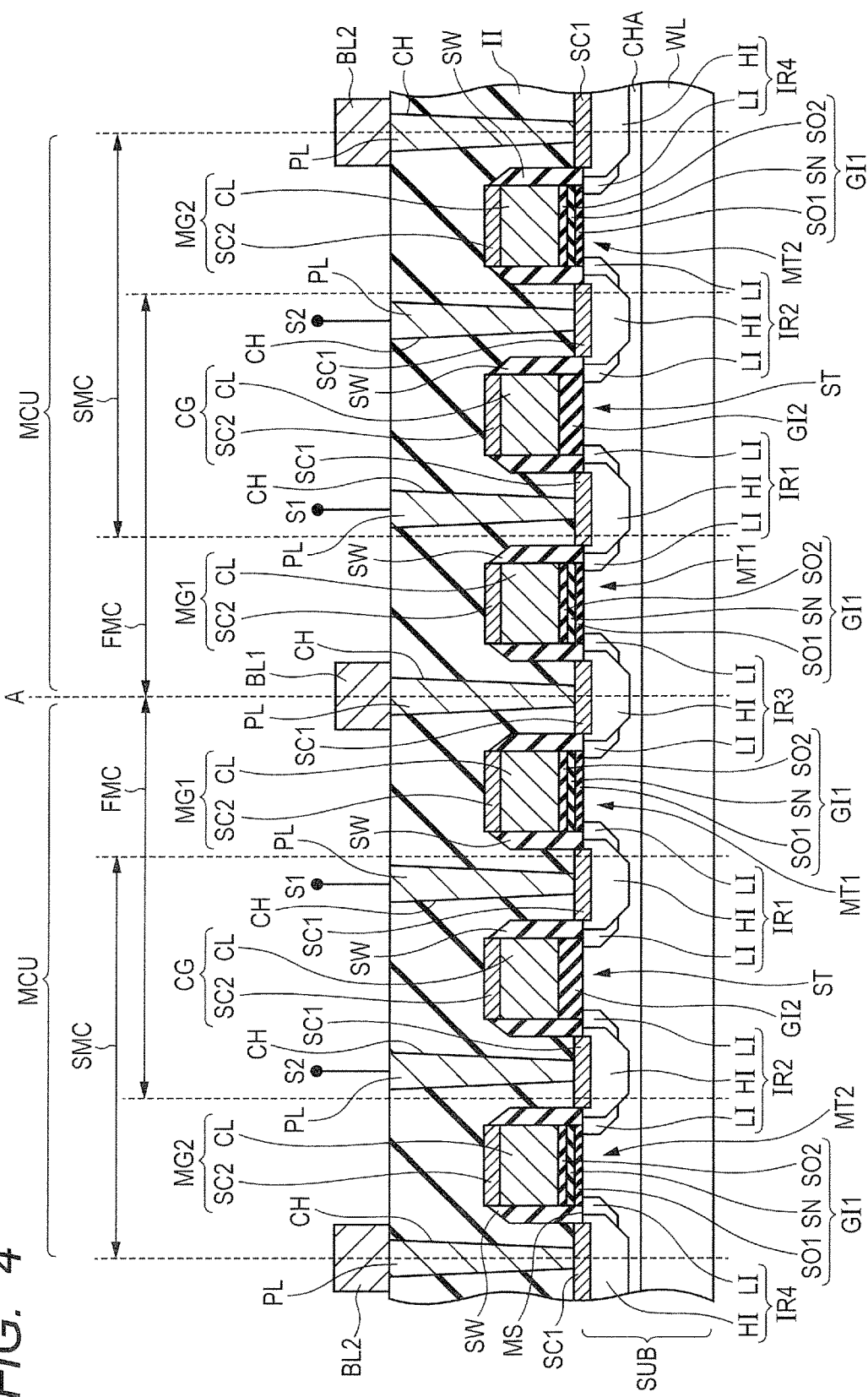
FIG. 4 is a schematic sectional view taken along the line IV-IV of FIG. 3.

As shown in FIG. 4, the semiconductor substrate SUB has a well region WL. In the semiconductor substrate SUB, a channel formation region CHA is located in a manner to contact the well region WL. The channel formation region CHA lies in the main surface MS of the semiconductor substrate SUB.

A first memory cell FMC and a second memory cell SMC are located on the main surface MS of the semiconductor substrate SUB. Specifically, memory transistors MT1 and MT2 and a selection transistor ST which configure the first memory cell FMC and the second memory cell SMC are formed on the main surface MS of the semiconductor substrate SUB.

The memory transistor MT1 includes an impurity region IR1 (first impurity region), an impurity region IR3 (third impurity region), a gate insulating film GI1, and a memory gate MG1 (first memory gate).

The impurity region IR1 and impurity region IR3 configure a pair of source/drain regions of the memory transistor MT1. The impurity region IR1 and impurity region IR3 are spaced from each other in the main surface MS of the semiconductor substrate SUB. For example, the impurity region IR1 and impurity region IR3 each have an LDD (Lightly Doped Drain) structure which includes a high concentration impurity region HI and a low concentration impurity region LI. A silicide layer SC1 is located in a manner to contact each of the impurity region IR1 and impurity region IR3.

The gate insulating film GI1 lies over a region of the semiconductor substrate SUB between the impurity region IR1 and impurity region IR3 and over the main surface MS of the semiconductor substrate SUB. The gate insulating film GI1 has a charge accumulation film SN (first charge accumulation film). The gate insulating film GI1 has a laminated structure in which, for example, a first silicon oxide film SO1, a silicon nitride film SN, and a second silicon oxide film SO2 are stacked in order.

The memory gate MG1 lies over the charge accumulation film SN (gate insulating film GI1). The memory gate MG1 includes a conductive film CL and a silicide layer SC2. The conductive film CL is made of, for example, polycrystalline silicon doped with impurities (doped polysilicon). The silicide layer SC2 lies over the conductive film CL. On the sidewall of the memory gate MG1, a sidewall insulating film SW in the form of a sidewall is formed.

The memory transistor MT2 includes an impurity region IR2 (second impurity region), an impurity region IR4 (fourth impurity region), a gate insulating film GI1, and a memory gate MG2 (second memory gate).

The impurity region IR2 and impurity region IR4 configure a pair of source/drain regions of the memory transistor MT2. The impurity region IR2 and impurity region IR4 are spaced from each other in the main surface MS of the semiconductor substrate SUB. For example, the impurity region IR2 and impurity region IR4 each have an LDD structure which includes a high concentration impurity region HI and a low concentration impurity region LI. A silicide layer SC1 is located in a manner to contact each of the impurity region IR2 and impurity region IR4.

The gate insulating film GI1 lies over a region of the semiconductor substrate SUB between the impurity region IR2 and impurity region IR4 and over the main surface MS of the semiconductor substrate SUB. The gate insulating film GI1 includes a charge accumulation film SN (second charge accumulation film). The gate insulating film GI1 has a laminated structure in which, for example, a first silicon oxide film SO1, a silicon nitride film SN, and a second silicon oxide film SO2 are stacked in order.

The memory gate MG2 lies over the charge accumulation film SN (gate insulating film GI1). The memory gate MG2 includes a conductive film CL and a silicide layer SC2. The conductive film CL is made of, for example, doped polysilicon. The silicide layer SC2 lies over the conductive film CL. On the sidewall of the memory gate MG2, a sidewall insulating film SW in the form of a sidewall is formed.

The selection transistor ST is located between the memory transistor MT1 and the memory transistor MT2. The selection transistor ST includes an impurity region IR1, an impurity region IR2, a gate insulating film GI2, and a control gate CG.

The impurity region IR1 and impurity region IR2 configure a pair of source/drain regions of the selection transistor ST. The impurity region IR1 and impurity region IR2 are spaced from each other in the main surface MS of the semiconductor substrate SUB.

The gate insulating film GI2 lies over a region of the semiconductor substrate SUB between the impurity region IR1 and impurity region IR2 and over the main surface MS of the semiconductor substrate SUB. The gate insulating film GI1 is an insulating film which is, for example, a single layer of silicon oxide film.

The control gate CG lies over the gate insulating film GI2. This isolates the control gate CG from the semiconductor substrate SUB. The control gate CG includes a conductive film CL and a silicide layer SC2. The conductive film CL is made of, for example, doped polysilicon. The silicide layer SC2 lies over the conductive film CL. On the sidewall of the control gate CG, a sidewall insulating film SW in the form of a sidewall is formed.

The silicide layers SC1 and SC2 are each made of, for example, NiSi.

The impurity region IR1 of the memory transistor MT1 and the impurity region IR1 of the selection transistor ST are the same impurity region. In short, the memory transistor MT1 and the selection transistor ST share the impurity region IR1.

Also, the impurity region IR2 of the memory transistor MT2 and the impurity region IR2 of the selection transistor ST are the same impurity region. In short, the memory transistor MT2 and the selection transistor ST share the impurity region IR2.

The first memory cell FMC and the second memory cell SMC share the selection transistor ST. Therefore, the first memory cell FMC and the second memory cell SMC share the control gate CG. The control gate CG can select the memory transistor MT1 and the memory transistor MT2.

An interlayer insulating film II lies over the main surface MS of the semiconductor substrate SUB. The interlayer insulating film II covers the memory transistors MT1 and MT2 and the selection transistor ST. The interlayer insulating film II has a plurality of contact holes CH. The contact holes CH each reach the silicide layer SC1.

A plug conductive film PL is provided in each of the contact holes CH. A bit line BL1 (first bit line) is electrically coupled to the impurity region IR3 through a plug conductive film PL and a silicide layer SC1. A bit line BL2 (second bit line) is electrically coupled to the impurity region IR4 through a plug conductive film PL and a silicide layer SC1.

A source line S1 (first source line) is electrically coupled to the impurity region IR1 through a plug conductive film PL and a silicide layer SC1. A source line S2 (second source line) is electrically coupled to the impurity region IR2 through a plug conductive film PL and a silicide layer SC1.

The first memory cell FMC and the second memory cell SMC configure a memory cell unit MCU. Two memory cell units MCU which are adjacent to each other in the column direction (direction in which the bit lines BL1 and BL2 extend) are symmetric (axisymmetric) with respect to boundary A between the two memory cell units MCU.

The memory transistor MT1 of one memory cell unit MCU and the memory transistor MT1 of the other memory cell unit MCU share the impurity region IR3.

Figure 3:
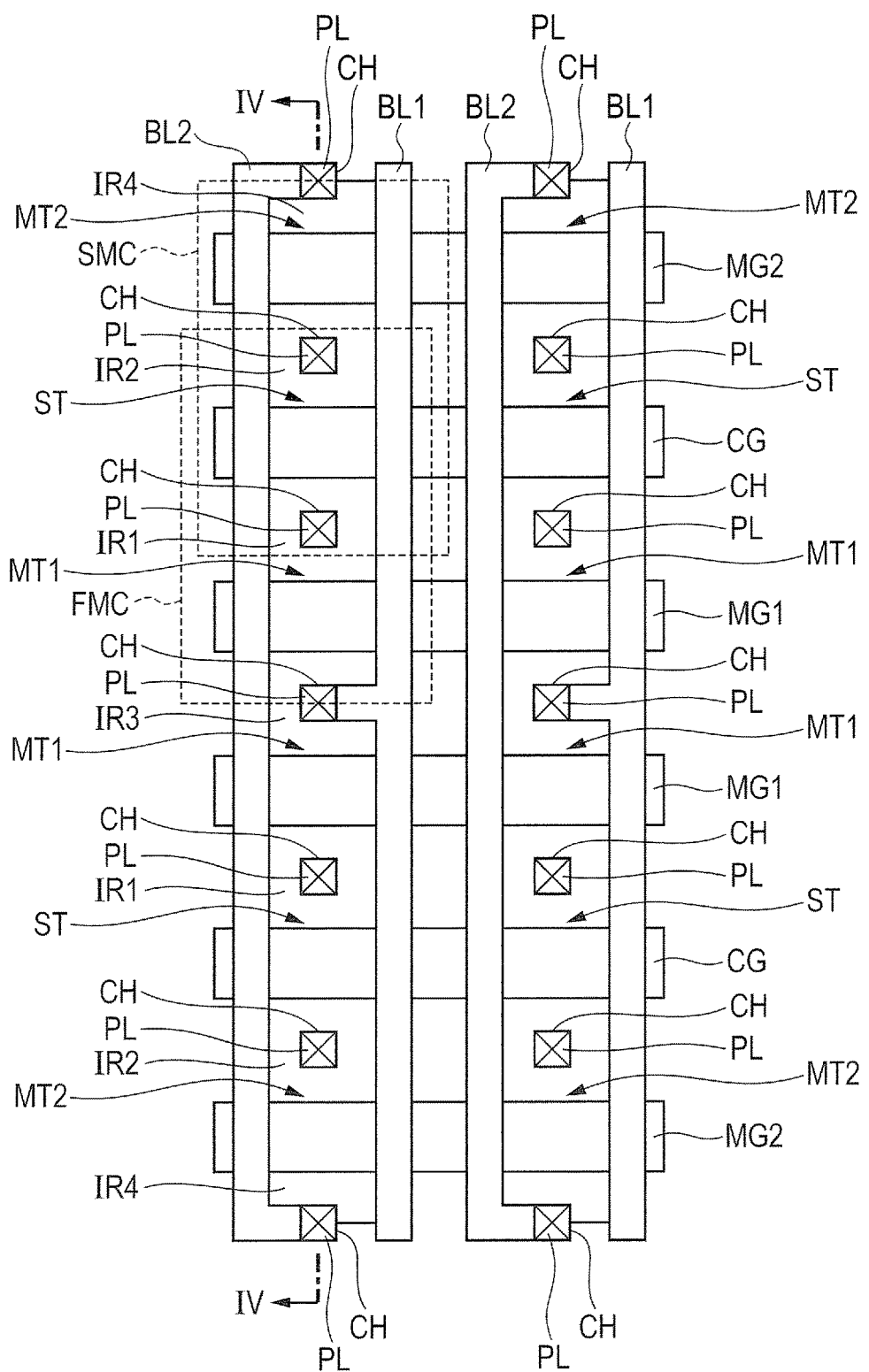
FIG. 3 is a plan view which shows a portion of the memory cell array region in the semiconductor device shown in FIG. 1.

As mainly shown in FIG. 3, in plan view, the memory gate MG1, memory gate MG2, and control gate CG extend in a manner to run parallel to each other. Also, in plan view, the bit line BL1 and bit line BL2 extend in a manner to run parallel to each other. In plan view, each of the gates (memory gate MG1, memory gate MG2, and control gate CG) and each of the bit lines BL1 and BL2 cross each other (for example, perpendicularly).

The control gate CG is sandwiched between the memory gate MG1 and the memory gate MG2 in plan view. The impurity region IR1 is sandwiched between the control gate CG and the memory gate MG1 in plan view. The impurity region IR2 is sandwiched between the control gate CG and the memory gate MG2 in plan view.

The memory gate MG1 is sandwiched between the impurity region IR1 and the impurity region IR3 in plan view. The memory gate MG2 is sandwiched between the impurity region IR2 and the impurity region IR4 in plan view.

In this specification, "plan view" means a view taken from the direction perpendicular to the main surface MS of the semiconductor substrate SUB as shown in FIG. 3.

Next, operation of the semiconductor device according to this embodiment will be described referring to FIGS. 5A and 5B.

In the description below, injection of electrons into the silicon nitride films as the charge accumulation layers of the memory transistors MT1 and MT2 is referred to as "write" and injection of holes (positive holes) is referred to as "erase".

Figure 5A:
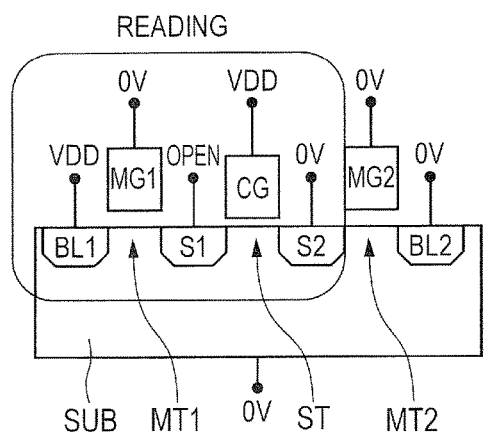

As shown in FIG. 5A, in reading the data stored in the memory transistor MT1, for example, supply voltage VDD is applied to the bit line BL1 and the control gate CG. Also, the source line S1 is set, for example, to OPEN and the memory gate MG1 and the source line S2 are, for example, set to 0 V. The memory gate MG2, the bit line BL2, and the semiconductor substrate SUB are set, for example, to 0 V.

When the voltage applied to the memory gate MG1 for reading is set to a value between the threshold voltage for the write state of the memory transistor MT1 and the threshold voltage for its erase state, it is possible to distinguish between the write state and the erase state.

Also, in reading the data stored in the memory transistor MT2, for example, supply voltage VDD is applied to the bit line BL2 and the control gate CG. Also, the source line S2 is set, for example, to OPEN and the memory gate MG2 and the source line S1 are, for example, set to 0 V. The memory gate MG2, the bit line BL1, and the semiconductor substrate SUB are set, for example, to 0 V.

Figure 5B:
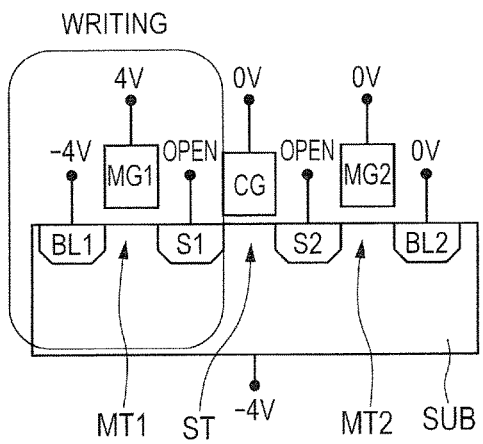

As shown in FIG. 5B, in writing data into the memory transistor MT1, for example, −4 V is applied to the bit line BL1, for example, 4 V is applied to the memory gate MG1, and the source line S1 is set, for example, to OPEN. Also, the source line S2 is, for example, set to OPEN, and the control gate CG, the memory gate MG2, and the bit line BL2 are set, for example, to 0 V, and the semiconductor substrate SUB is set, for example, to −4 V.

As the potential difference between the bit line BL1 and the memory gate MG1 becomes large, electrons are injected from the bit line BL1 into the silicon nitride film as the charge accumulation layer. Consequently, the threshold voltage of the memory transistor MT1 increases and writing is done.

In writing data into the memory transistor MT2, for example, −4 V is applied to the bit line BL2, for example, 4 V is applied to the memory gate MG2, and the source line S2 is set, for example, to OPEN. Also, the source line S1 is, for example, set to OPEN, and the control gate CG, the memory gate MG1, and the bit line BL1 are set, for example, to 0 V, and the semiconductor substrate SUB is, for example, set to −4 V.

In erasing the data in the memory transistors MT1 and MT2, for example, 5 V is applied to the bit lines BL1 and BL2, the source lines S1 and S2, and the semiconductor substrate SUB. Also, −5 V is applied to the memory gates MG1 and MG2 and the control gate CG is set to 0 V. Consequently, electrons are drawn from the silicon nitride films as the charge accumulation films of the memory transistors MT1 and MT2 into the bit lines BL1 and BL2, and the source lines S1 and S2. Consequently, the threshold voltages of the memory transistors MT1 and MT2 decrease and erasure is done.

Next, a method for manufacturing the semiconductor device according to this embodiment will be described referring to FIGS. 6 to 17. In the description below, it is assumed that a high voltage MOS (Metal Oxide Semiconductor) transistor and a low voltage MOS transistor are formed together with memory cells shown in FIGS. 3 and 4.

As shown in FIG. 6, for example, an STI (Shallow Trench Isolation) is formed as an element isolation structure EI in the main surface MS of the semiconductor substrate SUB. The STI is formed by making a trench TR in the main surface MS of the semiconductor substrate SUB and burying an insulating film BI (buried insulating film) in a manner to fill the trench TR.

Then, a channel formation region CHA is formed over the well region WL of the semiconductor substrate SUB. Alternatively, an STI may be formed after forming a channel formation region CHA over the well region WL.

As shown in FIG. 7, an insulating film GI2 is formed over the main surface MS of the semiconductor substrate SUB. The insulating film GI2 is, for example, a silicon oxide film.

As shown in FIG. 8, patterning is done on the insulating film GI2 by an ordinary photoengraving technique and an etching technique. Consequently, the insulating film GI2 in each of the formation regions for a selection transistor ST, a high voltage MOS transistor, and a low voltage MOS transistor remains intact and the rest of the insulating film GI2 is removed.

Figure 9:
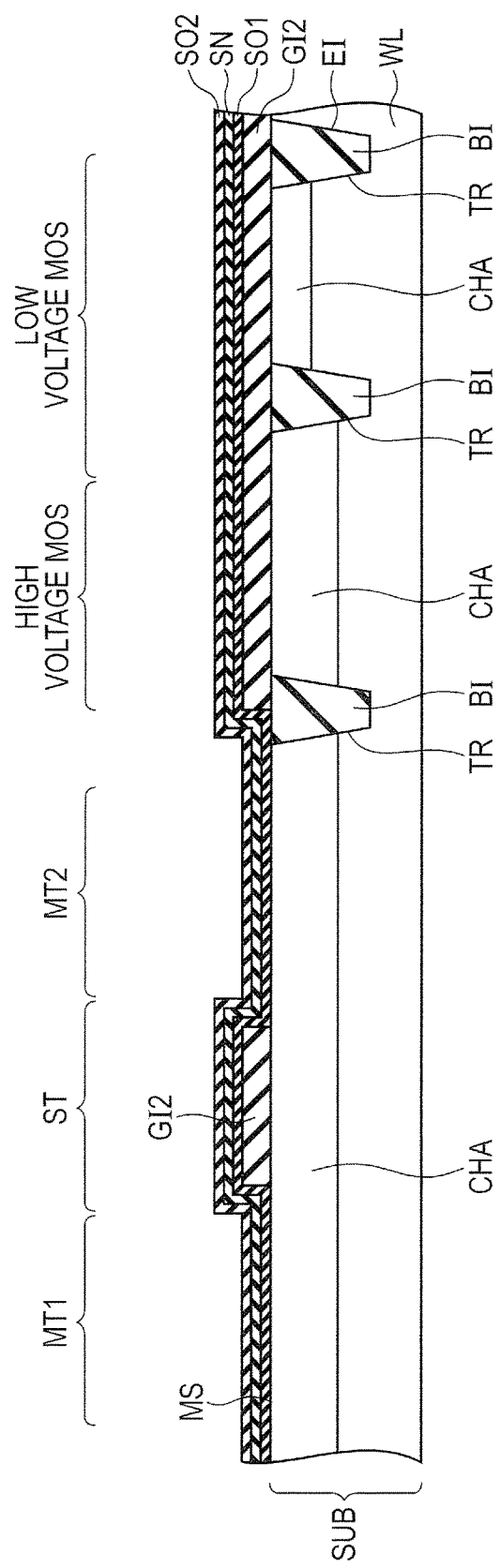
FIG. 9 is a schematic sectional view which shows the fourth step of the method for manufacturing the semiconductor device shown in FIGS. 3 and 4.

As shown in FIG. 9, a first silicon oxide film SO1, a silicon nitride film SN, and a second silicon oxide film SO2 are stacked over the main surface MS of the semiconductor substrate SUB in order. This laminated structure is formed in a manner to cover the insulating film GI2.

Figure 10:
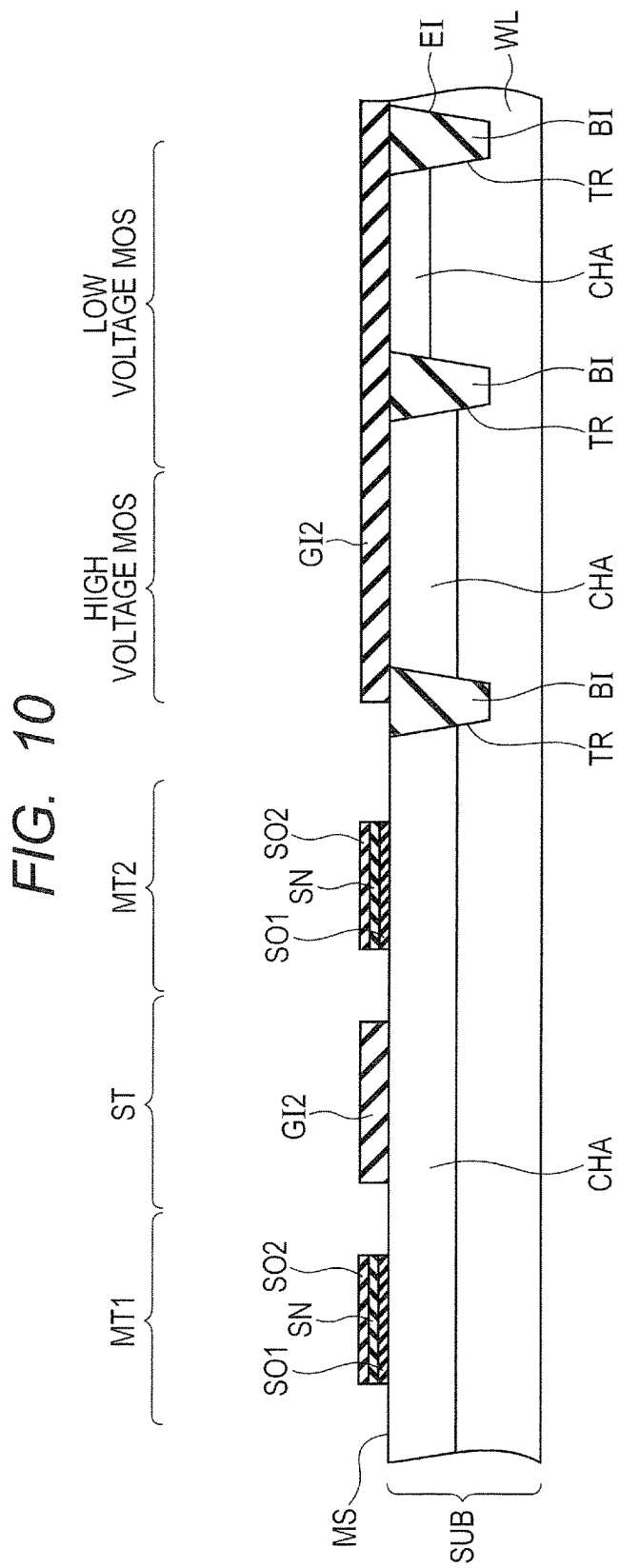
FIG. 10 is a schematic sectional view which shows the fifth step of the method for manufacturing the semiconductor device shown in FIGS. 3 and 4.

As shown in FIG. 10, patterning is done on the second silicon oxide film SO2, the silicon nitride film SN, and the first silicon oxide film SO1 in order by an ordinary photoengraving technique and an etching technique. Consequently, the laminated structure, in which the first silicon oxide film SO1, the silicon nitride film SN, and the second silicon oxide film SO2 are stacked, remains intact in the formation region for each of the memory transistors MT1 and MT2.

Figure 11:
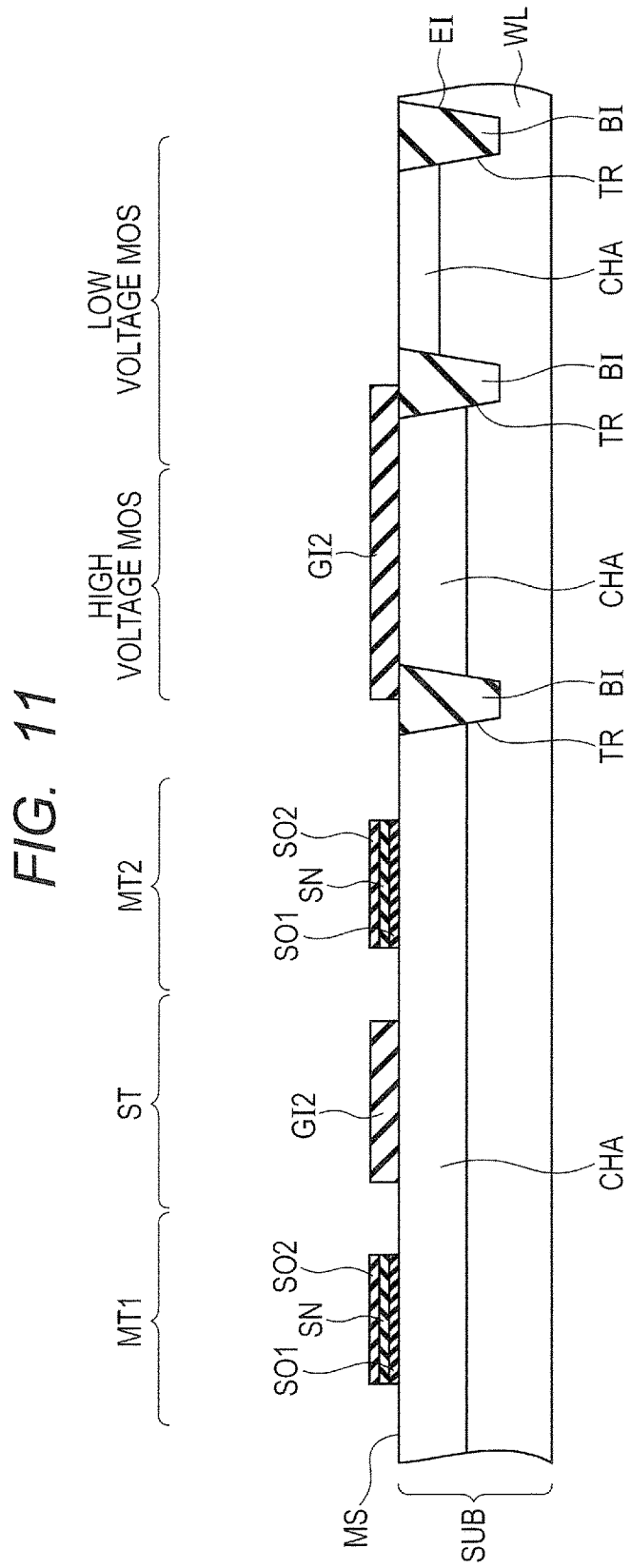
FIG. 11 is a schematic sectional view which shows the sixth step of the method for manufacturing the semiconductor device shown in FIGS. 3 and 4.

As shown in FIG. 11, the insulating film GI2 in the formation region for the low voltage MOS transistor is removed.

Figure 12:
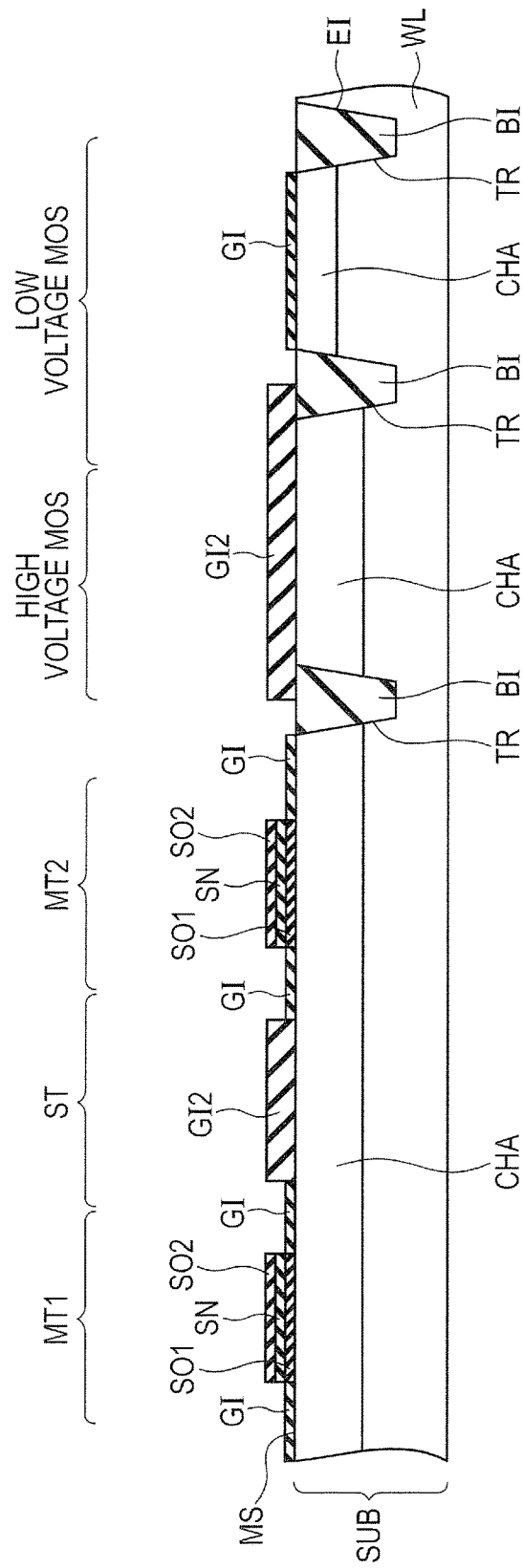
FIG. 12 is a schematic sectional view which shows the seventh step of the method for manufacturing the semiconductor device shown in FIGS. 3 and 4.

As shown in FIG. 12, the exposed main surface MS of the semiconductor substrate SUB is oxidized. Consequently, an insulating film GI as a silicon oxide film is formed on the exposed main surface MS of the semiconductor substrate SUB.

Figure 13:
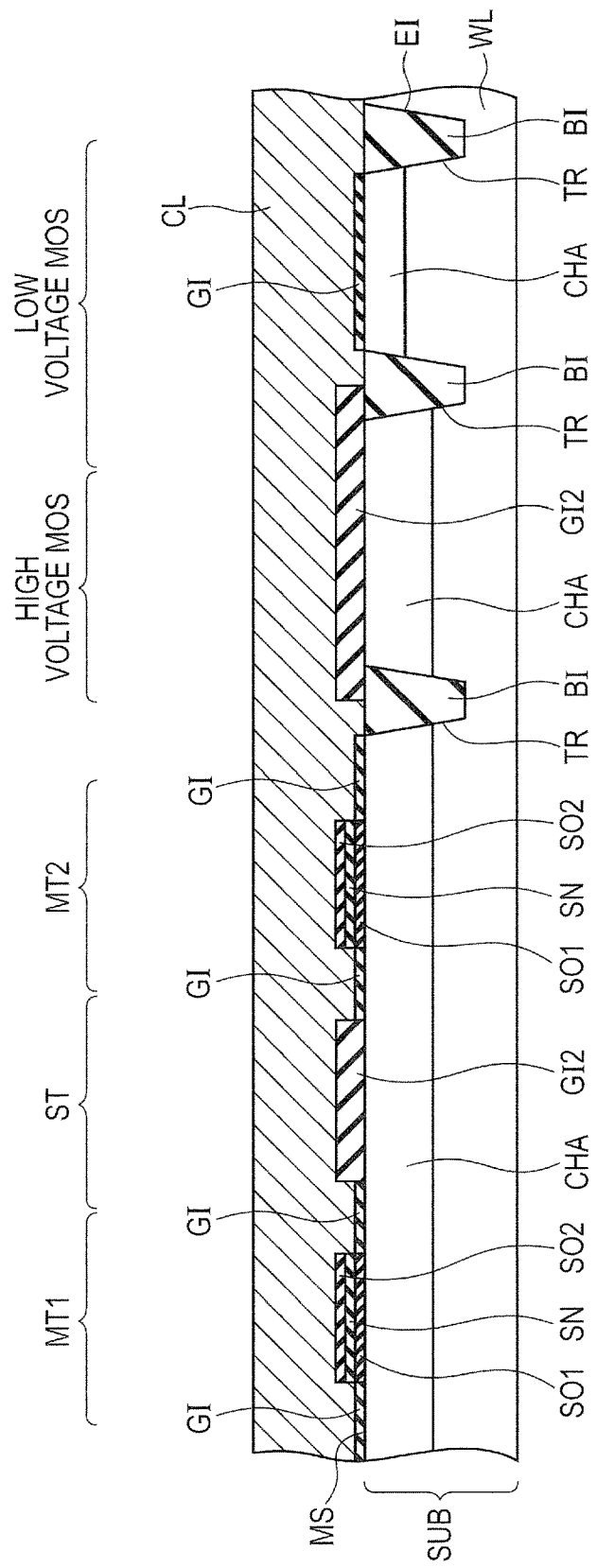
FIG. 13 is a schematic sectional view which shows the eighth step of the method for manufacturing the semiconductor device shown in FIGS. 3 and 4.

As shown in FIG. 13, a conductive film CL, for example, of doped polysilicon is formed over the main surface MS of the semiconductor substrate SUB.

Figure 14:
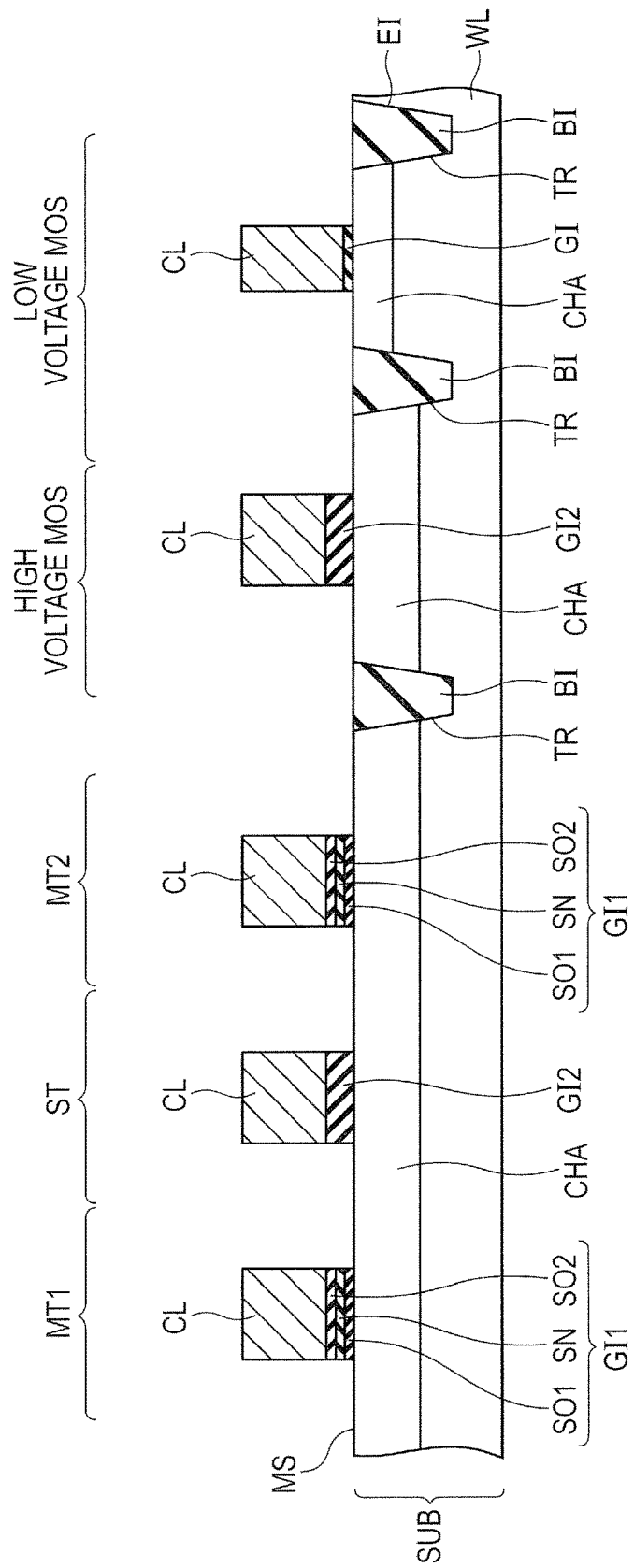
FIG. 14 is a schematic sectional view which shows the ninth step of the method for manufacturing the semiconductor device shown in FIGS. 3 and 4.

As shown in FIG. 14, patterning is done by an ordinary photoengraving technique and an etching technique so that the conductive film CL is shaped like a gate. Patterning is also done on the first silicon oxide film SO1, silicon nitride film SN and second silicon oxide film SO2. Also, patterning is done on the insulating films GI1 and GI2. Consequently, gate insulating films GI, GI1, and GI2 are formed.

Figure 15:
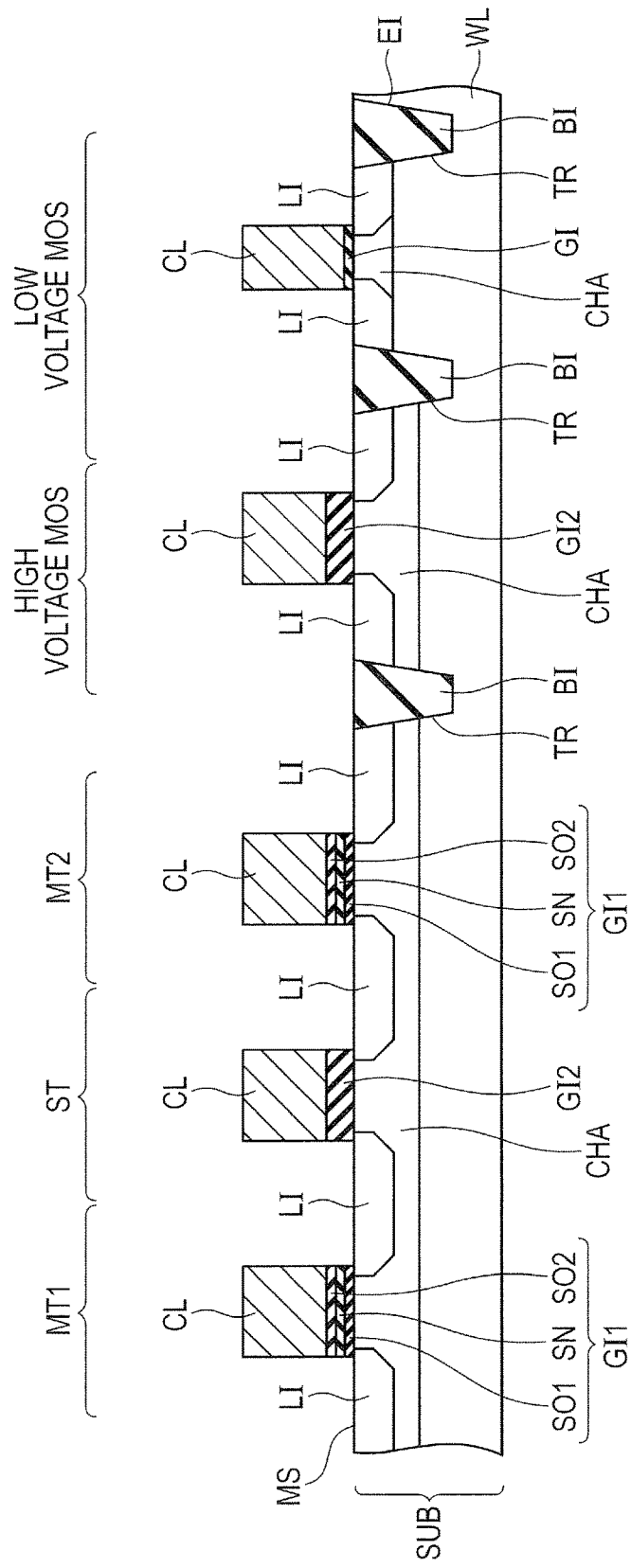
FIG. 15 is a schematic sectional view which shows the tenth step of the method for manufacturing the semiconductor device shown in FIGS. 3 and 4.

As shown in FIG. 15, impurity ions are implanted into the main surface MS of the semiconductor substrate SUB using the conductive film CL as a mask. Consequently, a low concentration impurity region LI is formed in the main surface MS of the semiconductor substrate SUB.

Figure 16:
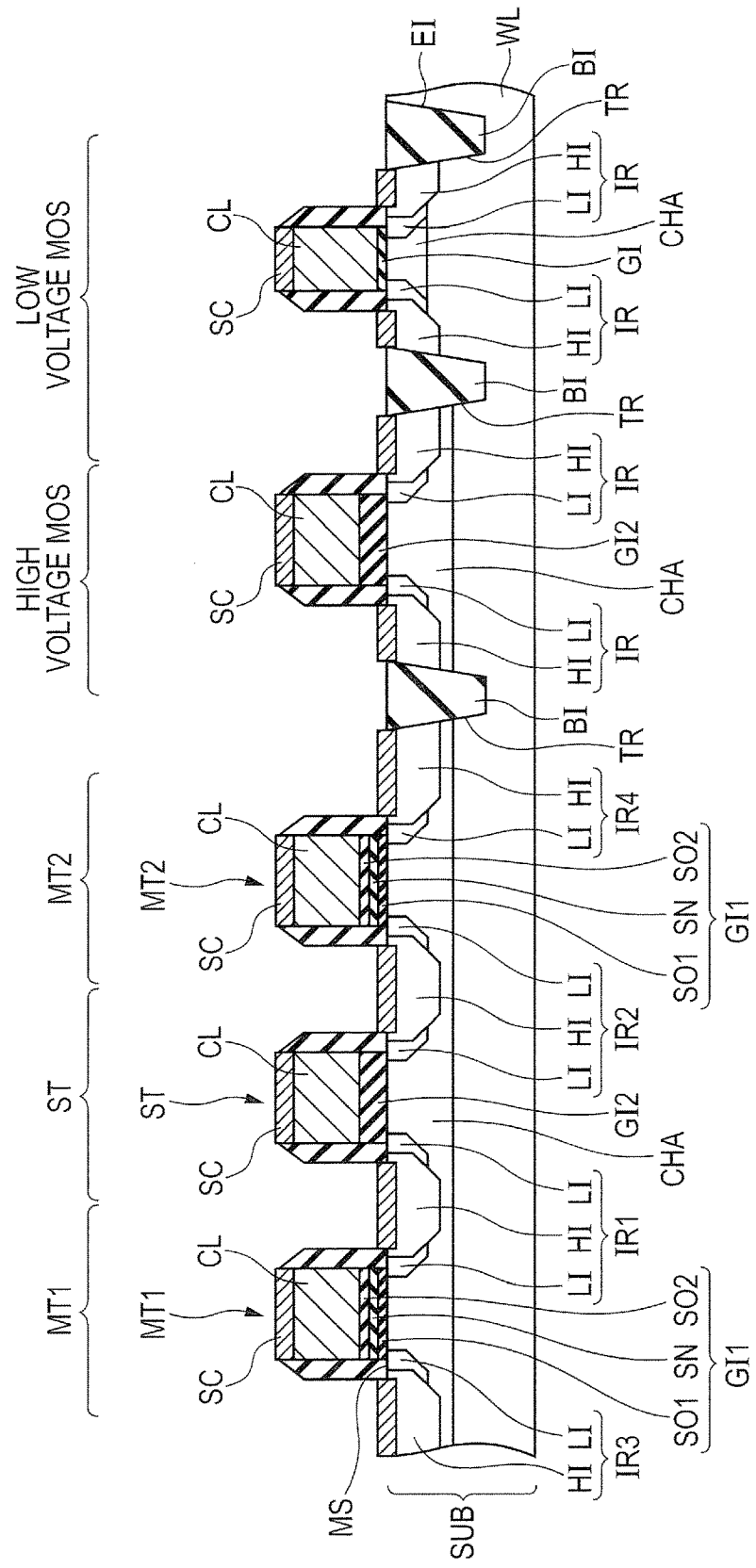
FIG. 16 is a schematic sectional view which shows the eleventh step of the method for manufacturing the semiconductor device shown in FIGS. 3 and 4.

As shown in FIG. 16, a sidewall insulating film SW in the form of a sidewall is formed on the sidewall of each conductive film CL. Impurity ions are implanted into the main surface MS of the semiconductor substrate SUB using the conductive film CL and the sidewall insulating film SW as a mask. Consequently, a high concentration impurity region HI is formed in the main surface MS of the semiconductor substrate SUB. The high concentration impurity region HI and the low concentration impurity region LI configure an LDD structure which forms each of impurity regions IR, IR1 to IR4.

After that, a silicide layer SC1 which contacts each of the impurity regions IR and IR1 to IR4 and a silicide layer SC2 which contacts the conductive film CL are formed. Consequently, gates MG1, MG2, CG, and GE are formed, in which each of the gates includes the conductive film CL and the silicide layer SC2. The silicide layers SC1 and SC2 are made of, for example, NiSi.

With the above steps, memory transistors MT1 and MT2, a selection transistor ST, a high voltage MOS transistor and a low voltage MOS transistor are formed.

Figure 17:
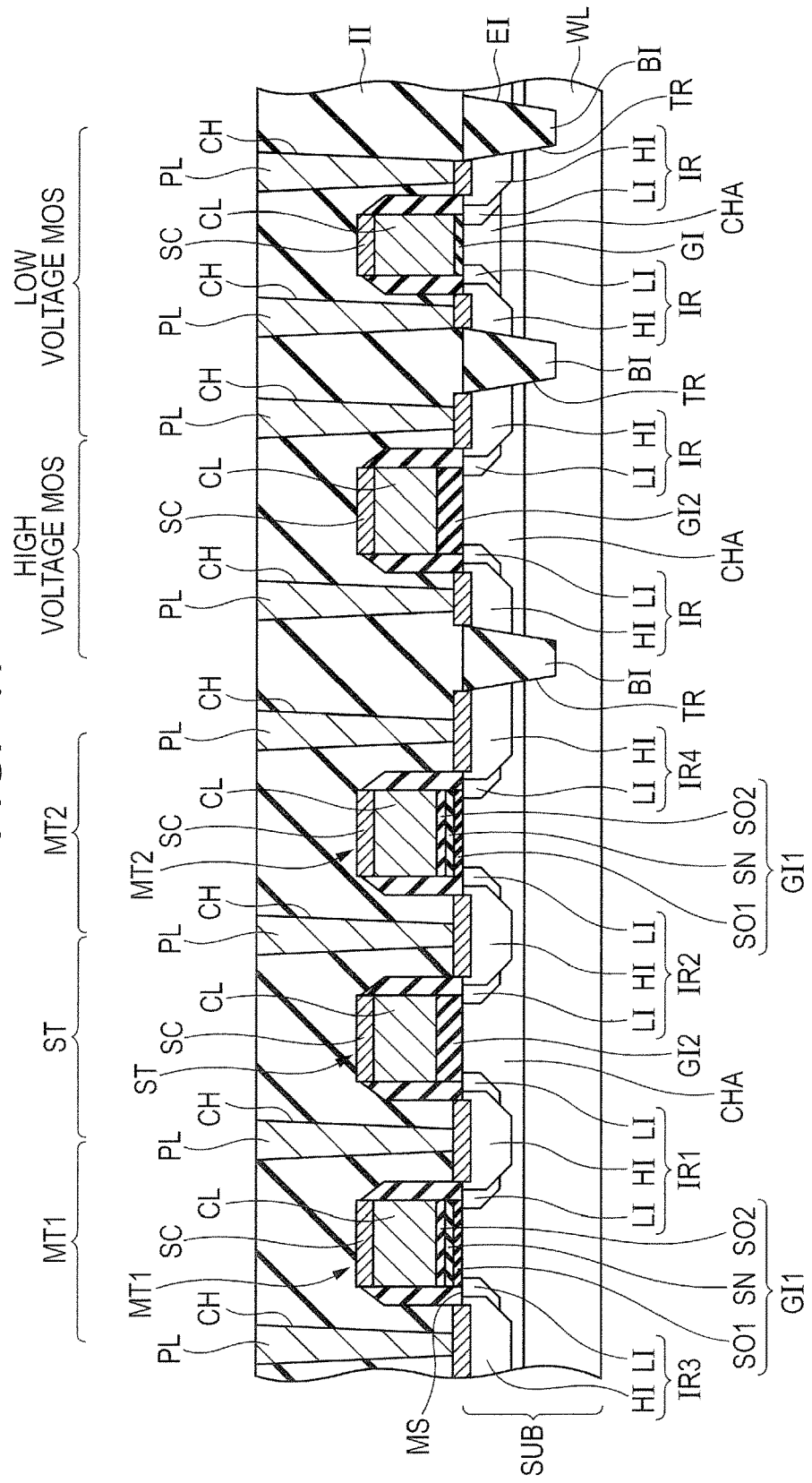
FIG. 17 is a schematic sectional view which shows the twelfth step of the method for manufacturing the semiconductor device shown in FIGS. 3 and 4.

As shown in FIG. 17, an interlayer insulating film II is formed over the main surface MS of the semiconductor substrate SUB in a manner to cover the transistors. A plurality of contact holes CH are made in the interlayer insulating film II by an ordinary photoengraving technique and an etching technique. A plug conductive film PL is formed in a manner to fill each of the contact holes CH. After that, bit lines BL1 and BL2 are formed. The semiconductor device according to this embodiment as shown in FIGS. 3 and 4 is thus produced.

Next, the effects of this embodiment will be explained in comparison with Comparative Example 1 shown in FIG. 18 and Comparative Example 2 shown in FIG. 19.

Figure 18:
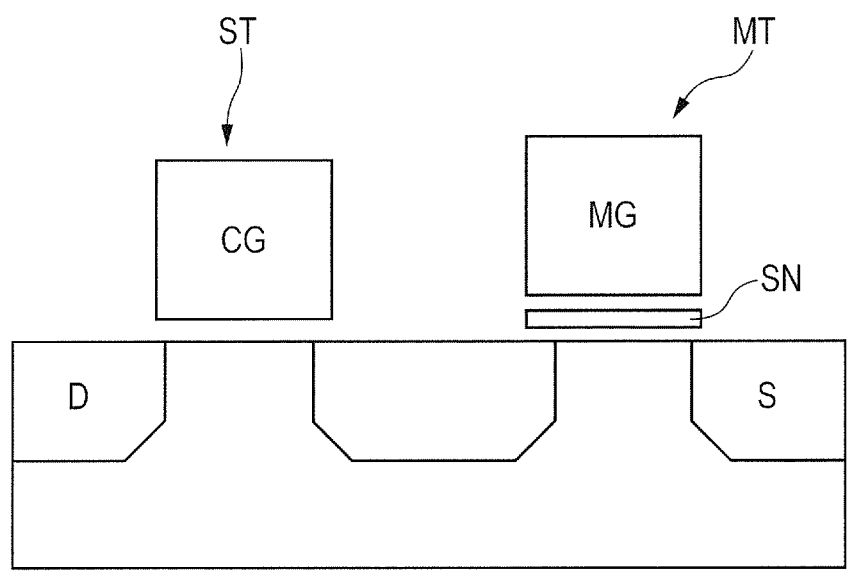
FIG. 18 is a schematic sectional view which shows the structure of Comparative Example 1.

In Comparative Example 1 as shown in FIG. 18, one memory cell includes two transistors, namely a MONOS transistor for charge accumulation MT and a transistor for memory selection ST. In Comparative Example 2 as shown in FIG. 19, one memory cell includes only one MONOS transistor.

Figure 20A:
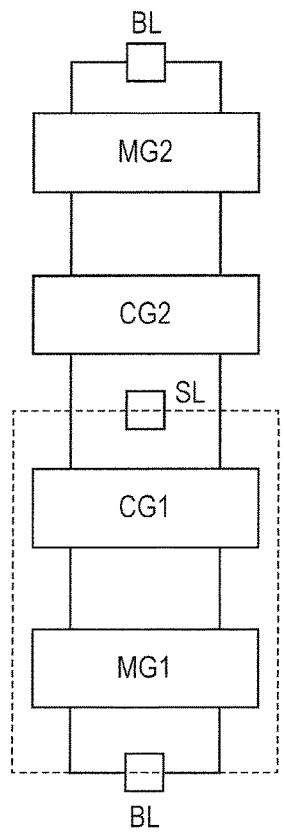
Figure 20B:
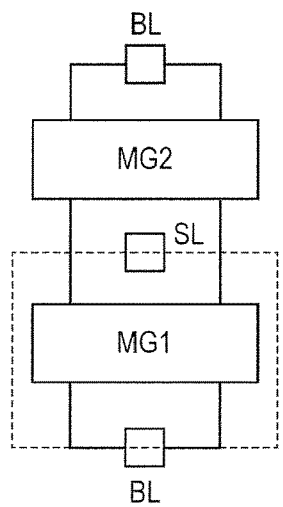
Figure 20C:
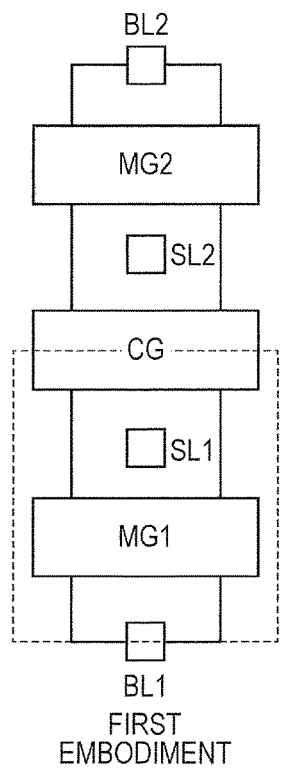

In Comparative Example 1 shown in FIG. 18, one memory cell includes two transistors. Therefore, when the two memory cells according to Comparative Example 1 are arranged side by side as shown in FIG. 20A, the planar area occupied by the memory cells is larger than that in this embodiment as shown in FIG. 20C.

Figure 19:
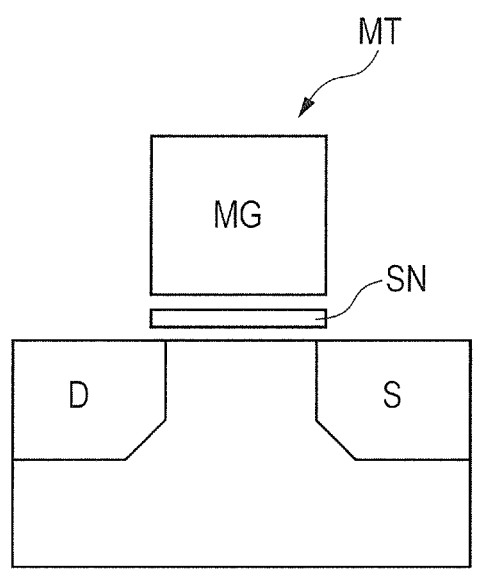
FIG. 19 is a schematic sectional view which shows the structure of Comparative Example 2.

On the other hand, Comparative Example 2 shown in FIG. 19 includes only one transistor. Therefore, as shown in FIG. 20B, the memory cell size in Comparative Example 2 is smaller than the cell size in Comparative Example 1 shown in FIG. 20A. However, in Comparative Example 2, disturbance occurs in reading operation.

Figure 21:
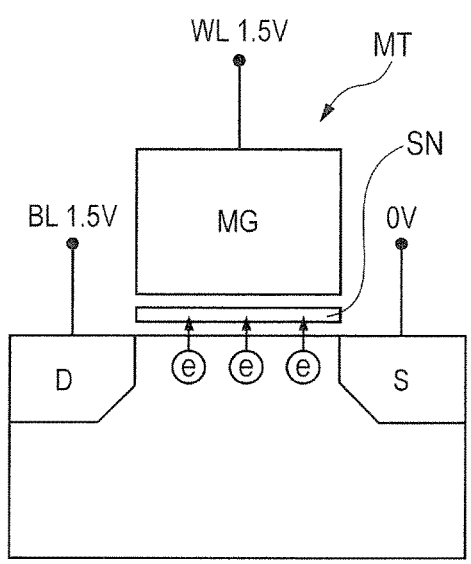
FIG. 21 is a schematic sectional view which explains disturbance in reading operation in Comparative Example 2.
Figure 22:
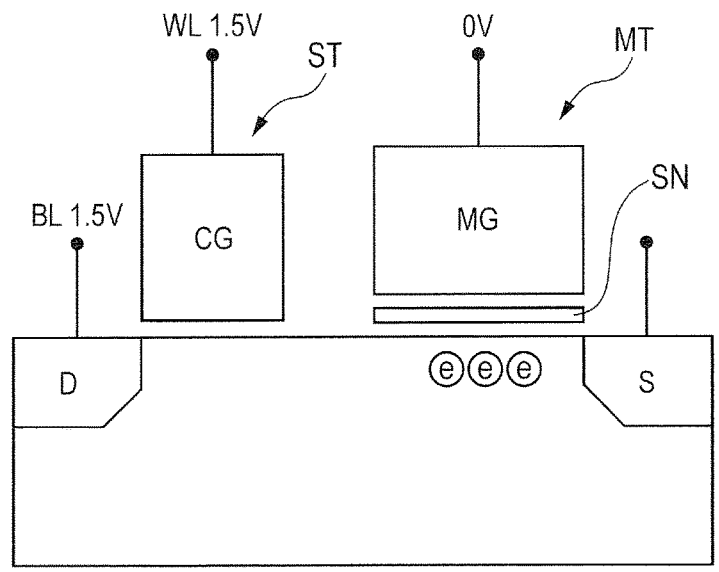
FIG. 22 is a schematic sectional view which illustrates how disturbance in reading operation can be suppressed when one memory cell includes a memory transistor and a selection transistor.

FIG. 21 is a schematic diagram which explains occurrence of disturbance in reading operation in Comparative Example 2. As shown in FIG. 21, in reading operation, a positive potential is applied from the word line WD to the memory gate MG. At this time, electrons are gradually injected from the semiconductor substrate SUB into the charge accumulation film SN. Consequently, the threshold voltage of the MONOS transistor MT changes and thus disturbance may occur.

In contrast, when one memory cell includes a transistor for charge accumulation MT and a transistor for memory selection ST, in reading operation, a positive potential is applied to the control gate CG but the memory gate MG is always at 0 V. Therefore, in reading operation, electrons are not injected into the charge accumulation film SN under the memory gate MG and thus disturbance is suppressed.

As explained above, in this embodiment, two memory cells share one selection transistor as shown in FIG. 20C. Therefore, only one gate, namely the control gate CG, exists between the memory gate MG1 and the memory gate MG2. Therefore, when two memory cells are arranged side by side, three transistors (three gates) are arranged side by side. Therefore, in this embodiment, the cell size can be smaller than in Comparative Example 1 which requires four transistors (four gates) as shown in FIG. 20A.

Furthermore, in this embodiment, as shown in FIGS. 3 and 4, one memory cell includes a memory transistor MT1 and a selection transistor ST. Also, in reading operation, the potential of the memory gates MG1 and MG2 is set to 0 V as shown in FIG. 5A. Therefore, in reading operation, electrons are not injected into the charge accumulation films SN under the memory gates MG1 and MG2 and thus disturbance is suppressed.

Furthermore, in this embodiment, the source line S1 is electrically coupled to the impurity region IR1 sandwiched between the memory gate MG1 and the control gate CG in plan view, as shown in FIGS. 3 and 4. Also, the source line S2 is electrically coupled to the impurity region IR2 sandwiched between the memory gate MG2 and the control gate CG in plan view. Consequently, the control gate CG can be an only one gate located between the first memory cell FMC and the second memory cell SMC, so the two memory cells FMC and SMC can share the selection transistor.

Furthermore, in this embodiment, as shown in FIG. 3, along the direction in which the bit lines BL1 and BL2 extend in plan view, the point where the bit line BL1 is coupled to a plug conductive film PL and the point where the bit line BL2 is coupled to a plug conductive film PL are alternately arranged. This makes it easy to design the bit lines BL1 and BL2.

Second Embodiment

Figure 23A:
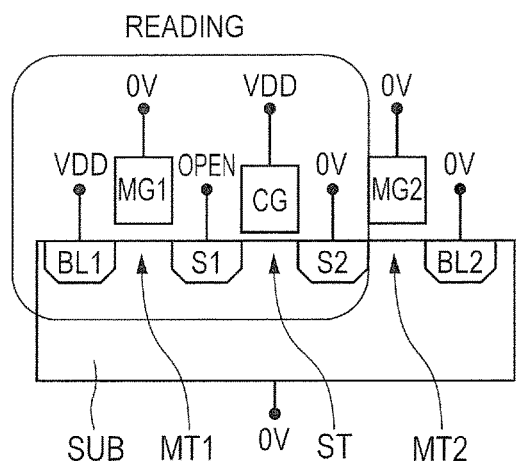
Figure 23B:
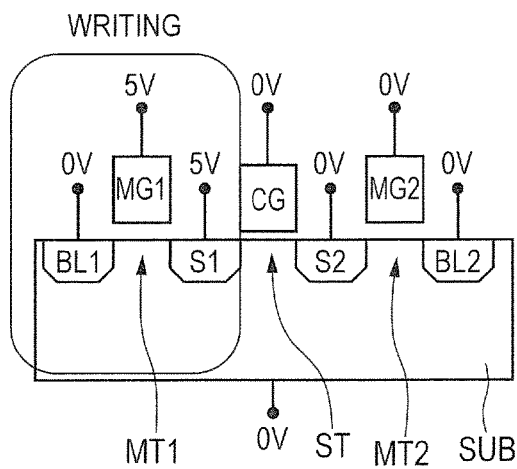

As shown in FIGS. 23A and 23B, the semiconductor device according to the second embodiment is structurally the same as the semiconductor device according to the first embodiment but it is different in terms of operation.

In this embodiment, the CHE (Channel Hot Electron) method is used to write data. Specifically, as shown in FIG. 23B, in writing data into the memory transistor MT1, the bit line BL1 is set, for example, to 0 V and for example, 5 V is applied to each of the memory gate MG1 and the source line S1. The control gate CG, the memory gate MG2, the source line S2, the bit line BL2, and the semiconductor substrate SUB are set, for example, to 0 V.

Consequently, an electric current flows in the channel region. This channel current is accelerated by the high electric field of the source line S1 to turn into hot electrons which are then injected into the charge accumulation film SN. As electrons are thus injected into the charge accumulation film SN, the threshold voltage of the memory transistor MT1 is increased and writing is done.

In writing data into the memory transistor MT2, the bit line BL2 is set, for example, to 0 V and for example, 5 V is applied to each of the memory gate MG2 and the source line S2. The control gate CG, the memory gate MG1, the source line S1, the bit line BL1, and the semiconductor substrate SUB are set, for example, to 0 V.

In this embodiment, reading operation is the same as in the first embodiment as shown in FIG. 23A and its explanation is not repeated here. Also, erasing operation is the same as in the first embodiment as shown in FIG. 23A and its explanation is not repeated here.

Third Embodiment

Figure 24:
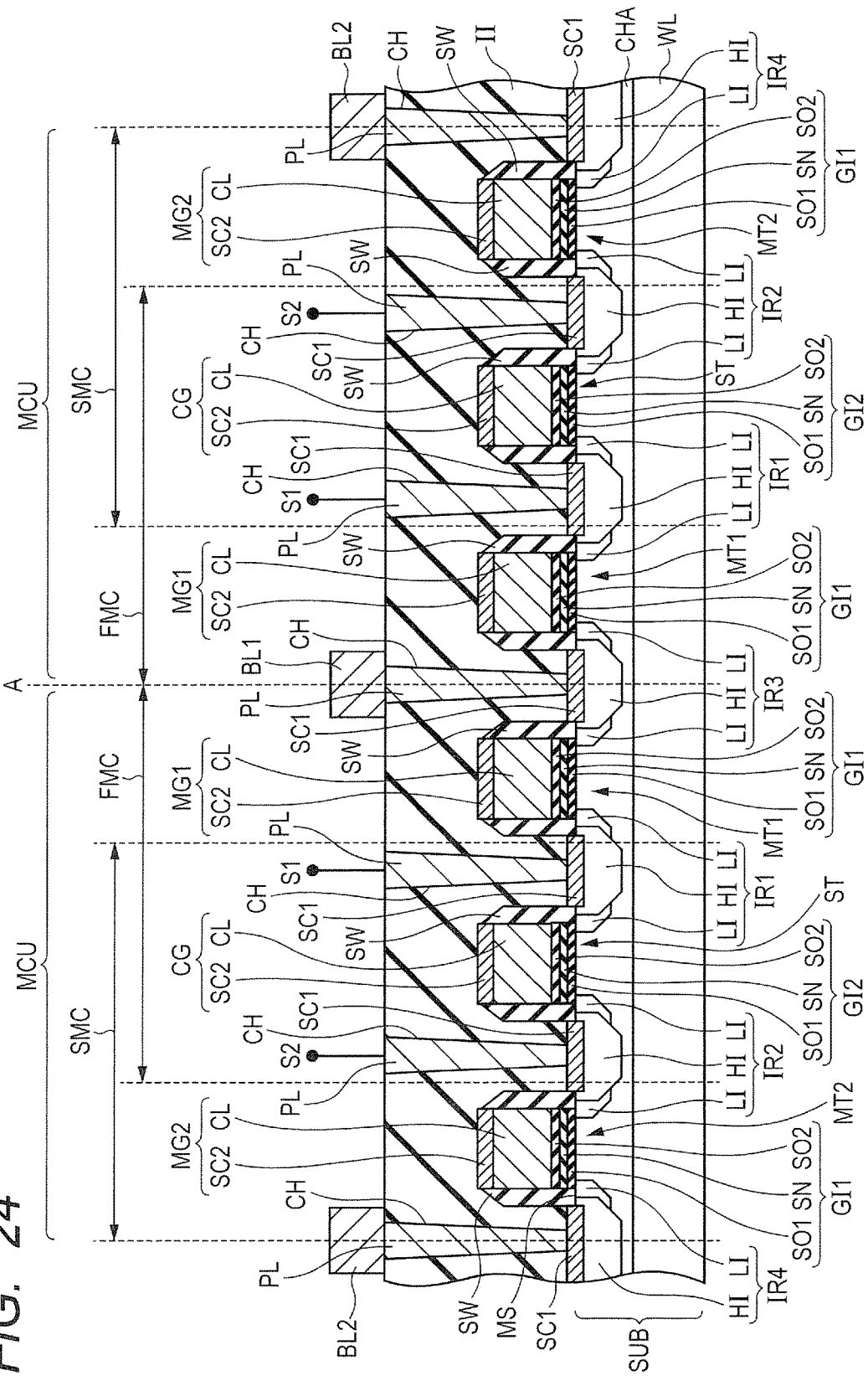
FIG. 24 is a sectional view which schematically shows a semiconductor device according to a third embodiment of the invention.

As shown in FIG. 24, the third embodiment is different from the first embodiment in terms of the composition of the gate insulating film GI2 of the selection transistor ST. In this embodiment, the gate insulating film GI2 of the selection transistor ST has a laminated structure in which a first silicon oxide film SO1, a silicon nitride film SN, and a second silicon oxide film SO2 are stacked in order. This means that the gate insulating films GI1 and GI2 of each of the memory transistors MT1 and MT2 and the selection transistor ST have the same laminated structure as mentioned above.

The elements other than the above in this embodiment are almost the same as in the first embodiment and the same elements as in the first embodiment are designated by the same reference signs and their description is not repeated here.

In the manufacturing method according to this embodiment, the earlier steps are the same as the steps shown in FIGS. 6 to 7 in the manufacturing method according to the first embodiment. After these steps, in the step shown in FIG. 8, the insulating film GI2 remains intact in the formation regions for the high voltage MOS transistor and the low voltage MOS transistor, but the insulating film GI2 in the formation regions for the memory transistors MT1 and MT2 and the selection transistor ST is removed. After that, the same steps as the steps shown in FIGS. 9 to 12 in the first embodiment are carried out in the manufacturing method according to this embodiment.

Figure 25:
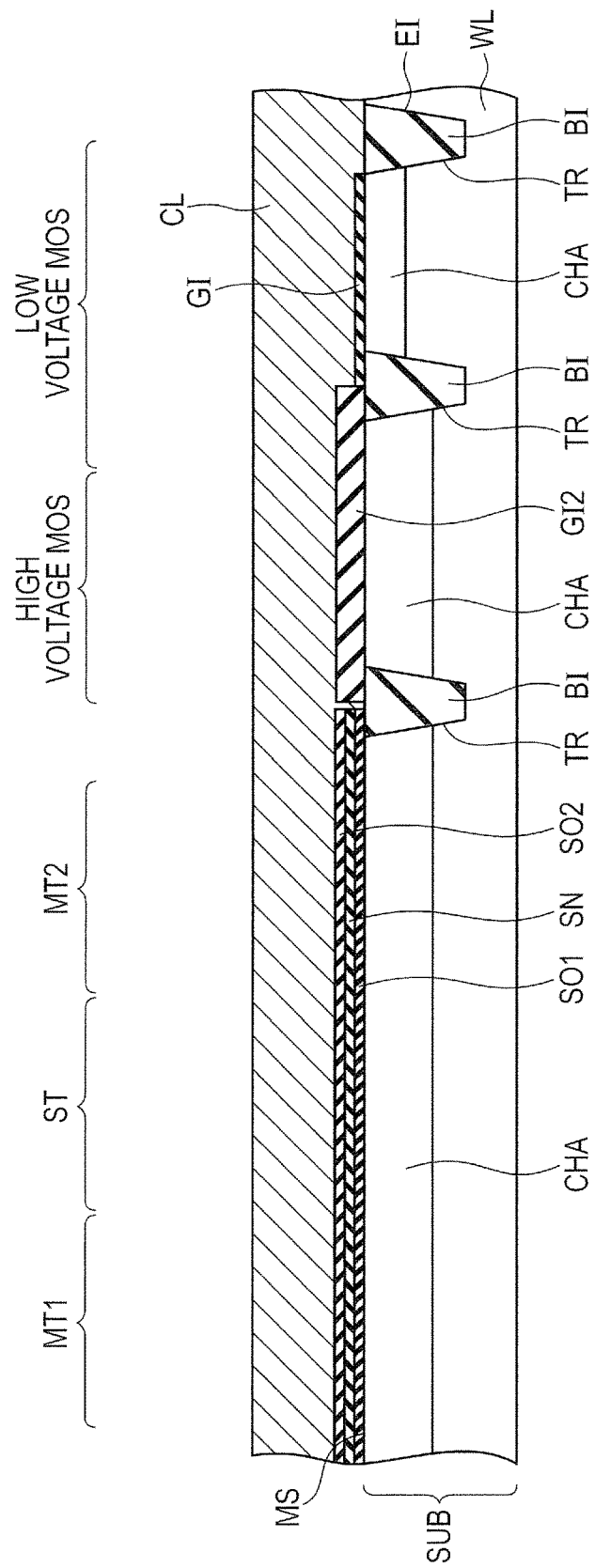
FIG. 25 is a schematic sectional view which shows the first step of a method for manufacturing the semiconductor device according to the third embodiment.

Consequently, as shown in FIG. 25, a laminated structure including a first silicon oxide film SO1, a silicon nitride film SN, and a second silicon oxide film SO2 is formed in the formation regions for the memory transistors MT1 and MT2 and the selection transistor ST. Also, an insulating film GI2 is formed in the formation region for the high voltage MOS transistor and an insulating film GI is formed in the formation region for the low voltage MOS transistor.

After that, a conductive film CL of, for example, doped polysilicon is formed over the main surface MS of the semiconductor substrate SUB.

Figure 26:
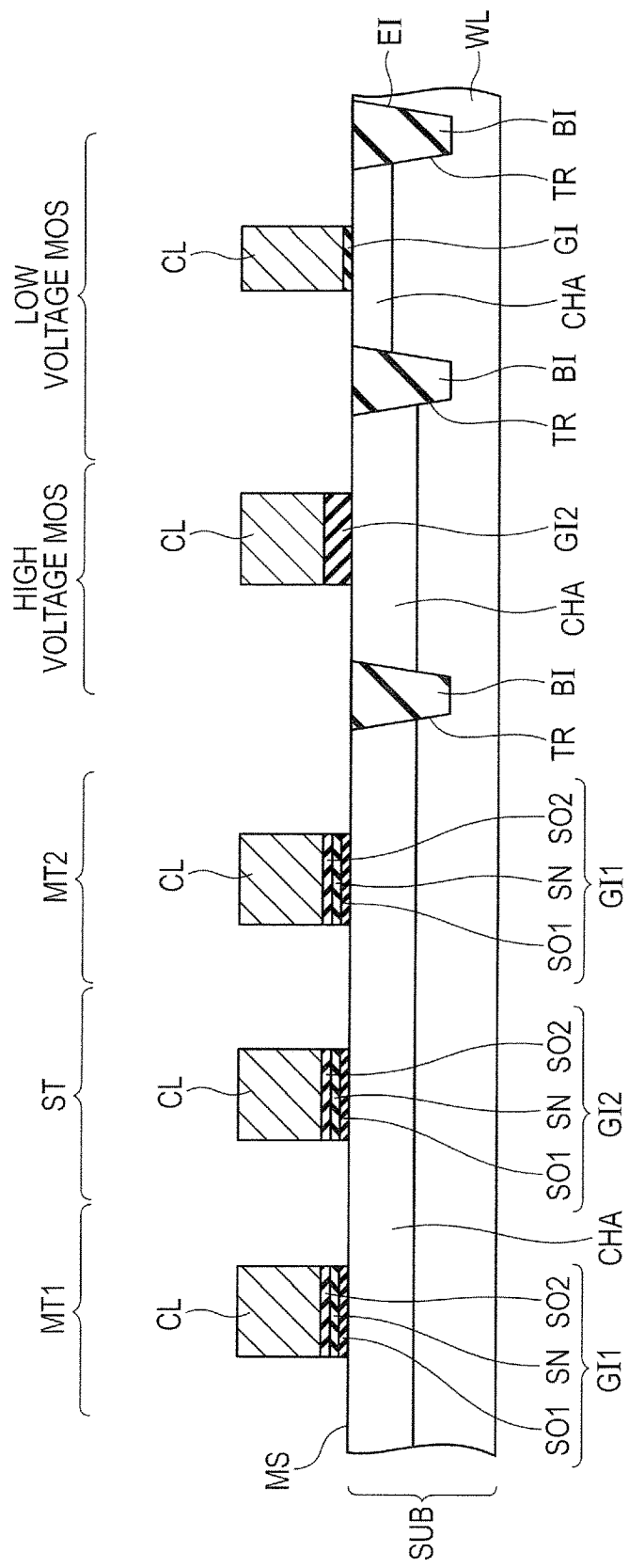
FIG. 26 is a schematic sectional view which shows the second step of the method for manufacturing the semiconductor device according to the third embodiment.

As shown in FIG. 26, patterning is done by an ordinary photoengraving technique and an etching technique so that the conductive film CL is shaped like a gate. Also, pattering is done on the first silicon oxide film SO1, silicon nitride film SN and second silicon oxide film SO2. Patterning is also done on the insulating films GI1 and GI2. Consequently, gate insulating films GI, GI1, and GI2 are formed. Thus, in this embodiment, the gate insulating film of each of the memory transistors MT1 and MT2 and the selection transistor ST has a laminated structure which includes a first silicon oxide film SO1, a silicon nitride film SN, and a second silicon oxide film SO2.

After that, the same steps as shown in FIGS. 15 to 17 are carried out to produce the semiconductor device according to this embodiment as shown in FIG. 24.

According to this embodiment, the gate insulating films GI1 and GI2 of the memory transistors MT1 and MT2 and the selection transistor ST have the same structure. For this reason, the steps to form the gate insulating films GI1 for the memory transistors MT1 and MT2 need not be different from the steps to form the gate insulating film GI2 for the selection transistor ST. Therefore, in this embodiment, the distance between the memory transistors MT1 and MT2 and the selection transistor ST can be smaller than when the steps to form the gate insulating films GI1 for the memory transistors MT1 and MT2 are different from the steps to form the gate insulating film GI2 for the selection transistor ST.

In the description of the above embodiments, it is assumed that the charge accumulation film is an insulating film such as a silicon nitride film. However, instead the charge accumulation film may be a conductive film such as a floating gate.

The invention made by the present inventors has been so far explained concretely in reference to the preferred embodiments thereof. However, the invention is not limited thereto and it is obvious that these details may be modified in various ways without departing from the gist thereof.

What is claimed is:

1. A semiconductor device comprising:
    a semiconductor substrate having a main surface;
    a first memory cell having a first memory transistor; and
    a second memory cell having a second memory transistor,
    the first memory transistor comprising:
        a first charge accumulation film disposed over the main surface of the semiconductor substrate; and
        a first memory gate disposed over the first charge accumulation film,
    the second memory transistor comprising:
        a second charge accumulation film disposed over the main surface of the semiconductor substrate; and
        a second memory gate disposed over the second charge accumulation film; and
    the device further comprising:
        a selection transistor having a control gate being shared by the first memory cell and the second memory cell and configured to select the first memory transistor and the second memory transistor,
    wherein the control gate is disposed between the first memory gate and the second memory gate in a cross-section view,
    wherein a first impurity region is disposed in the main surface of the semiconductor substrate and, in a plan view, located between the control gate and the first memory gate,
    wherein a first source line is electrically coupled to the first impurity region,
    wherein a second impurity region is disposed in the main surface of the semiconductor substrate and, in the plan view, located between the control gate and the second memory gate, and
    wherein a second source line is electrically coupled to the second impurity region.

2. The semiconductor device according to claim 1, wherein:
    a third impurity region is disposed in the main surface of the semiconductor substrate and, in the plan view, the first memory gate is located between the first impurity region and the third impurity region;
    a fourth impurity region is disposed in the main surface of the semiconductor substrate and, in the plan view, the second memory gate is located between the second impurity region and the fourth impurity region;
    a first bit line is electrically coupled to the third impurity region; and a second bit line is electrically coupled to the fourth impurity region and, in the plan view, extends parallel to the first bit line.

3. The semiconductor device according to claim 1, wherein a laminated structure in which a first silicon oxide film, a silicon nitride film, and a second silicon oxide film are stacked in order is disposed between the first memory gate and the main surface of the semiconductor substrate, between the second memory gate and the main surface of the semiconductor substrate, and between the control gate and the main surface of the semiconductor substrate.

4. A semiconductor device comprising:
 a semiconductor substrate having a main surface;
 a first memory transistor having a first charge accumulation film disposed over the main surface of the semiconductor substrate and a first memory gate disposed over the first charge accumulation film;
 a selection transistor having a control gate disposed over the main surface of the semiconductor substrate in a manner to be isolated from the semiconductor substrate; and
 a first source line disposed over the main surface of the semiconductor substrate,
 wherein the first memory transistor and the selection transistor share a first impurity region disposed between the first memory gate and the control gate in plan view, and
 wherein the first source line is electrically coupled to the first impurity region.

5. The semiconductor device according to claim 4, further comprising:
 a second memory transistor having a second charge accumulation film disposed over the main surface of the semiconductor substrate and a second memory gate disposed over the second charge accumulation film; and
 a second source line disposed over the main surface of the semiconductor substrate,
 wherein the second memory transistor and the selection transistor share a second impurity region located between the second memory gate and the control gate in plan view, and
 wherein the second source line is electrically coupled to the second impurity region.

6. The semiconductor device according to claim 5, wherein a gate insulating film of each of the first memory transistor, the second memory transistor, and the selection transistor has a laminated structure in which a first silicon oxide film, a silicon nitride film, and a second silicon oxide film are stacked in order.

7. A semiconductor device manufacturing method comprising:
 forming a first memory cell having a first memory transistor including a first charge accumulation film disposed over a main surface of a semiconductor substrate and a first memory gate disposed over the first charge accumulation film;
 forming a second memory cell having a second memory transistor including a second charge accumulation film disposed over the main surface of the semiconductor substrate and a second memory gate disposed over the second charge accumulation film; and
 forming a selection transistor having a control gate to be shared by the first memory cell and the second memory cell and configured to select the first memory transistor and the second memory transistor,
 wherein the control gate is formed so as to be disposed between the first memory gate and the second memory gate in a cross-sectional view.

8. The semiconductor device manufacturing method according to claim 7, wherein the first memory gate, the second memory gate, and the control gate are formed from the same conductive layer for a gate.

9. The semiconductor device manufacturing method according to claim 8, wherein a laminated structure in which a first silicon oxide film, a silicon nitride film, and a second silicon oxide film are stacked in order is formed between the first memory gate and the main surface of the semiconductor substrate, between the second memory gate and the main surface of the semiconductor substrate, and between the control gate and the main surface of the semiconductor substrate.

10. The semiconductor device according to claim 1, wherein the control gate of the selection transistor is disposed over the main surface of the semiconductor substrate.

11. The semiconductor device according to claim 1, wherein the first and second source lines are disposed over the main surface of the semiconductor substrate.

12. The semiconductor device according to claim 5, wherein the control gate of the selection transistor is disposed between the first memory gate and the second memory gate in a cross-sectional view.

13. The semiconductor device manufacturing method according to claim 7, wherein the control gate of the selection transistor is formed over the main surface of the semiconductor substrate.

14. The semiconductor device manufacturing method according to claim 7, further comprising forming a first source line over the main surface of the semiconductor substrate and electrically coupled to a first impurity region shared by the first memory and selection transistors.

* * * * *